US012811549B2

(12) United States Patent
Ono et al.

(10) Patent No.: US 12,811,549 B2
(45) Date of Patent: Nov. 24, 2026

(54) SIGNAL GENERATION DEVICE AND SIGNAL GENERATION METHOD

(71) Applicant: ANRITSU CORPORATION, Kanagawa (JP)

(72) Inventors: Hirofumi Ono, Kanagawa (JP); Naoto Miyauchi, Kanagawa (JP); Yasuki Hirakawa, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 327 days.

(21) Appl. No.: 18/616,690

(22) Filed: Mar. 26, 2024

(65) Prior Publication Data

US 2024/0339968 A1 Oct. 10, 2024

(30) Foreign Application Priority Data

Apr. 5, 2023 (JP) ................................ 2023-061208

(51) Int. Cl.
*H03F 3/19* (2006.01)

(52) U.S. Cl.
CPC ......... *H03F 3/19* (2013.01); *H03F 2200/451* (2013.01)

(58) Field of Classification Search
CPC ............................ H03F 3/19; H03F 2200/451
USPC .......................................................... 330/291
See application file for complete search history.

(56) References Cited

U.S. PATENT DOCUMENTS 5,974,040 A * 10/1999 Kimura ................ H03G 3/3068 370/347
5,995,853 A * 11/1999 Park ..................... H03G 3/3042 455/574
8,265,581 B2 * 9/2012 Kim ..................... H03G 3/3042 455/240.1
12,445,140 B2 * 10/2025 Ono ........................ H03M 1/66
2011/0019783 A1 * 1/2011 Nakano ..................... H03J 3/08 375/344
2015/0381032 A1 * 12/2015 Li .......................... H02M 1/36 323/271
2021/0328604 A1 * 10/2021 Goto ...................... H04B 17/13

FOREIGN PATENT DOCUMENTS

JP 2021118447 A 8/2021

* cited by examiner

*Primary Examiner* — Hafizur Rahman
(74) *Attorney, Agent, or Firm* — McDonald Hopkins LLC

(57) ABSTRACT

An object of the present invention is to provide a signal generation device and a signal generation method, the signal generation device having a function of preventing the power of the analog RF signal which is output by the RF converter from exceeding the rating of the RF amplifier and a function of checking whether or not the RF converter and the RF amplifier are connected to each other. According to the present invention, there is provided a signal generation device in which the control performed by the control unit includes adjusting an output of the RF converter based on a detected voltage which is output by the detector, and determining whether or not the RF converter and the RF amplifier are connected to each other based on a change in the detected voltage when the attenuation amount of the variable attenuator is changed.

2 Claims, 3 Drawing Sheets

| No. | Amplification amount (dB) | Threshold value (V) | Detected voltage (V) | Differential voltage (V) | Determination |
|---|---|---|---|---|---|
| 1 | -23 | 3.2 | 0.789 | 0.789=0.789-0 | Does not exceed rating |
| 2 | -13 | 0.6 | 0.801 | 0.012=0.801-0.789 | Determination is impossible |
| 3 | +12 | 0.6 | 2.272 | 1.483=2.272-0.789 | Determine connection |

FIG. 3

SIGNAL GENERATION DEVICE AND SIGNAL GENERATION METHOD

TECHNICAL FIELD

The present disclosure relates to a signal generation device and a signal generation method for generating a test signal.

BACKGROUND ART

A signal generation device that generates a test signal for testing a mobile communication device is proposed (refer to, for example, Patent Document 1). The signal generation device disclosed in Patent Document 1 includes an RF converter that generates an analog radio frequency (RF) signal by converting an analog signal for testing into a radio frequency, performs amplification and power adjustment on the analog RF signal, and outputs the processed analog RF signal from an antenna. In addition, Patent Document 1 discloses a method for preventing the output power of the analog RF signal from exceeding a predetermined upper limit value in the RF converter.

RELATED ART DOCUMENT

Patent Document

[Patent Document 1] JP-A-2021-118447

DISCLOSURE OF THE INVENTION

Problem that the Invention is to Solve

Depending on the test of the mobile communication device, an RF amplifier that amplifies the output of the RF converter may be provided at a rear stage of the signal generation device disclosed in Patent Document 1 or a front stage of the antenna. In a case of such a configuration, the following two problems exist.

(Problem 1) The power of the analog RF signal which is output by the signal generation device varies due to disturbances such as temperature. It is necessary to prevent an analog RF signal having power exceeding the rating of the RF amplifier from being input to the RF amplifier. However, the signal generation device disclosed in Patent Document 1 has a problem in that it is difficult to check the power of the analog RF signal to be output.

(Problem 2) The RF converter and the RF amplifier are connected to each other via an RF cable, and the analog RF signal is input from the RF converter to the RF amplifier via the RF cable. However, the signal generation device disclosed in Patent Document 1 does not include means for checking whether or not the RF converter and the RF amplifier are connected to each other via the RF cable. As a result, there is a problem in that it is difficult to determine whether or not the test on the mobile communication device is being correctly performed.

Therefore, in order to solve the above two problems, an object of the present invention is to provide a signal generation device and a signal generation method of the signal generation device, the signal generation device having a function of preventing the power of the analog RF signal which is output by the RF converter from exceeding the rating of the RF amplifier and a function of checking whether or not the RF converter and the RF amplifier are connected to each other via the RF cable.

Means for Solving the Problem

In order to achieve the above object, a signal generation device according to the present invention monitors an output value (detected voltage) of a detector included in the RF amplifier, and monitors a behavior of the detected voltage when an amplification amount of the analog RF signal in the RF amplifier is changed.

Specifically, according to claim 1 of the present invention, there is provided a signal generation device including: an RF converter (2) that modulates an analog signal for testing and outputs an analog RF signal; an RF amplifier (3) that includes a variable attenuator (7) which adjusts an amplitude of the analog RF signal by an attenuation amount and a detector (9) which detects the analog RF signal having the adjusted amplitude; and a control unit (11) that performs control of the RF converter and the RF amplifier, in which the control performed by the control unit includes adjusting an output of the RF converter based on a detected voltage which is output by the detector when the RF converter outputs the analog RF signal, and determining whether or not the RF converter and the RF amplifier are connected to each other based on a change in the detected voltage when the attenuation amount of the variable attenuator is changed.

The signal generation device prevents the power of the analog RF signal from exceeding the rating of the RF amplifier by adjusting the power of the analog RF signal which is output by the RF converter based on the detected voltage of the detector included in the RF amplifier. Further, the signal generation device determines whether or not the RF converter and the RF amplifier are connected to each other via the RF cable from the behavior of the detected voltage when the amplification amount of the analog RF signal in the RF amplifier is changed.

Therefore, according to the present invention, it is possible to provide a signal generation device having a function of preventing the power of the analog RF signal which is output by the RF converter from exceeding the rating of the RF amplifier and a function of checking whether or not the RF converter and the RF amplifier are connected to each other via the RF cable.

According to claim 2 of the present invention, in the signal generation device, in a case of adjusting the output of the RF converter, the control unit performs a comparison process of comparing the detected voltage which is output by the detector when the RF converter outputs the analog RF signal with a first threshold value, and causes the RF converter to decrease power of the analog RF signal by a certain amount and to output the analog RF signal having the decreased power, and performs the comparison process again in a case where the detected voltage exceeds the first threshold value.

The signal generation device prevents the power of the analog RF signal from exceeding the rating of the RF amplifier by performing the above-described operations.

According to the present disclosure, in the signal generation device, in a case of determining whether or not the RF converter and the RF amplifier are connected to each other, the control unit sets the detected voltage as a reference value in a case where the detected voltage does not exceed the first threshold value, and calculates a differential voltage between a detected voltage which is output by the detector when the attenuation amount of the variable attenuator is decreased and the reference value, determines that the RF converter and the RF amplifier are connected to each other in a case where the differential voltage exceeds a second threshold value, further decreases the attenuation amount of the variable attenuator, and repeats a rechecking process of comparing the differential voltage with the second threshold value i n a case where the differential voltage does not exceed the second threshold value, determines that the RF converter and the RF amplifier are connected to each other in a case where the differential voltage exceeds the second threshold value in the rechecking process, and determines that the RF converter and the RF amplifier are not connected to each other in a case where the differential voltage does not exceed the second threshold value even after the rechecking process is performed a predetermined number of times.

The signal generation device determines whether or not the RF converter and the RF amplifier are connected to each other via the RF cable by performing the above-described operations.

According to the present disclosure, there is provided a signal generation method performed by the signal generation device according to claim 1, the method including: performing a comparison process of comparing a detected voltage which is output by the detector when the RF converter outputs the analog RF signal with a first threshold value; causing the RF converter to decrease power of the analog RF signal by a certain amount and to output the analog RF signal having the decreased power, and performing the comparison process again in a case where the detected voltage exceeds the first threshold value; setting the detected voltage as a reference value in a case where the detected voltage does not exceed the first threshold value, and calculating a differential voltage between a detected voltage which is output by the detector when the attenuation amount of the variable attenuator is decreased and the reference value; determining that the RF converter and the RF amplifier are connected to each other in a case where the differential a second threshold value; further decreasing the attenuation amount of the variable attenuator, and repeating a rechecking process of comparing the differential voltage with the second threshold value in a case where the differential voltage does not exceed the second threshold value; determining that the RF converter and the RF amplifier are connected to each other in a case where the differential voltage exceeds the second threshold value in the rechecking process; and determining that the RF converter and the RF amplifier are not connected to each other in a case where the differential voltage does not exceed the second threshold value even after the rechecking process is performed a predetermined number of times.

According to the signal generation method, it is possible to prevent the power of the analog RF signal from exceeding the rating of the RF amplifier by adjusting the power of the analog RF signal which is output by the RF converter based on the detected voltage of the detector included in the RF amplifier. Further, according to the signal generation method, it is possible to determine whether or not the RF converter and the RF amplifier are connected to each other via the RF cable from the behavior of the detected voltage when the amplification amount of the analog RF signal in the RF amplifier is changed.

Therefore, according to the present invention, it is possible to provide a signal generation method having a function of preventing the power of the analog RF signal which is output by the RF converter from exceeding the rating of the RF amplifier and a function of checking whether or not the RF converter and the RF amplifier are connected to each other via the RF cable.

The above inventions can be combined as much as possible.

Advantage of the Invention

According to the present invention, it is possible to provide a signal generation device and a signal generation method, the signal generation device having a function of preventing the power of the analog RF signal which is output by the RF converter from exceeding the rating of the RF amplifier and a function of checking whether or not the RF converter and the RF amplifier are connected to each other via the RF cable.

BRIEF DESCRIPTION OF THE DRAWINGS

FIG. 3 is a diagram illustrating an example of the signal generation method according to the present invention.

BEST MODE FOR CARRYING OUT THE INVENTION

Figure 1:
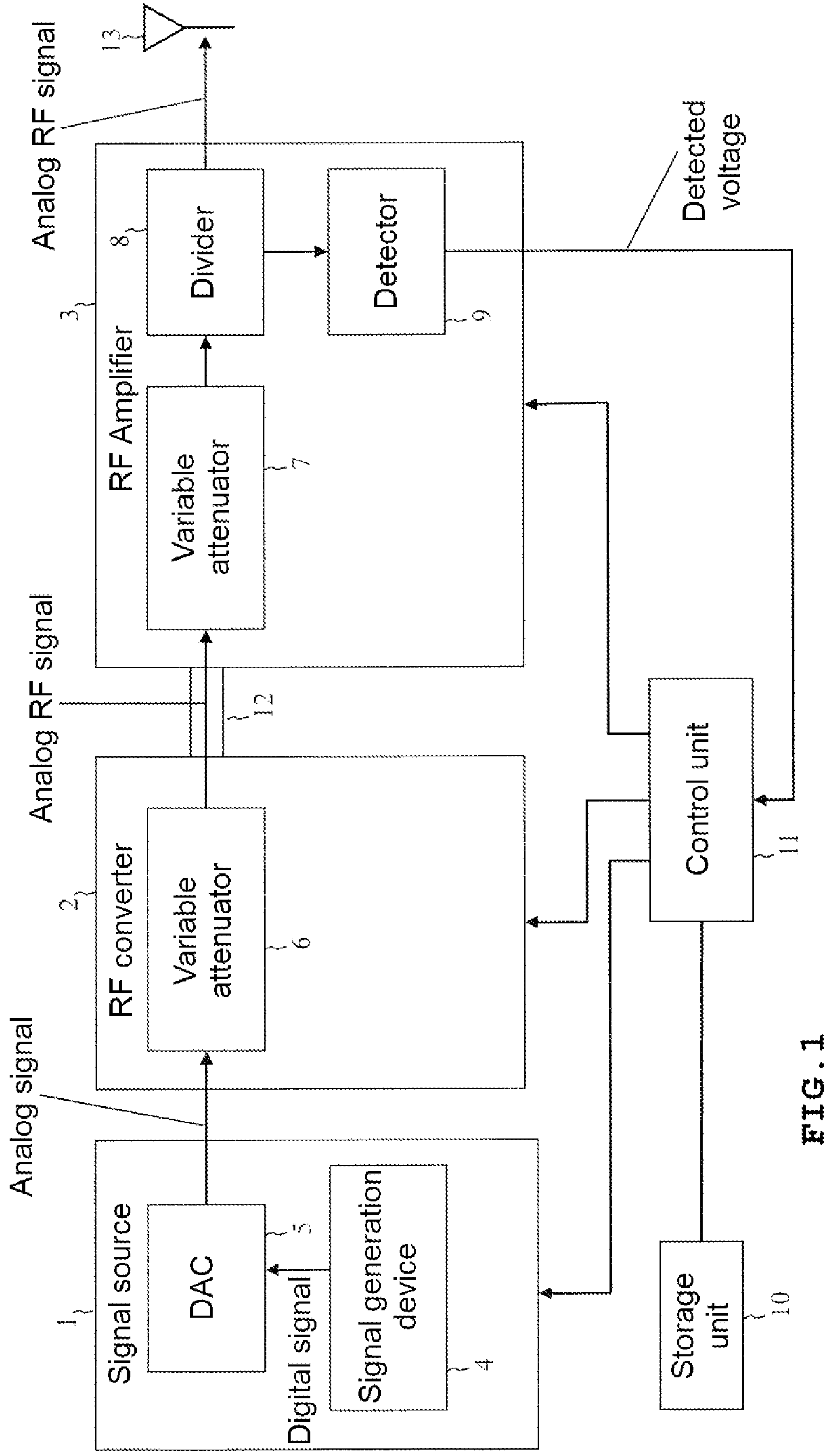
FIG. 1 is a diagram illustrating a configuration of a signal generation device according to the present invention.

Hereinafter, an embodiment of the present disclosure will be described in detail with reference to the drawings. The present disclosure is not limited to the embodiment described below. These implementation examples are merely illustrative, and the present disclosure can be implemented in various modified and improved forms based on the knowledge of those skilled in the art. It is assumed that, in this specification and the drawings, components having the same reference numerals are the same as each other.

FIG. 1 is a diagram illustrating a configuration of a signal generation device according to the present embodiment. The signal generation device includes an RF converter 2 that modulates an analog signal for testing and outputs an analog RF signal, an RF amplifier 3 that includes a variable attenuator 7 which adjusts an amplitude of the analog RF signal by an attenuation amount and a detector 9 which detects the analog RF signal having the adjusted amplitude, and a control unit 11 that performs control of the RF converter 2 and the RF amplifier 3. In the signal generation device, the control performed by the control unit 11 includes adjusting an output of the RF converter 2 based on a detected voltage which is output by the detector 9 when the RF converter 2 outputs the analog RF signal, and determining whether or not the RF converter 2 and the RF amplifier 3 are connected to each other based on a change in the detected voltage when the attenuation amount of the variable attenuator 7 is changed.

A signal source 1 includes a signal generation device 4 that generates a digital signal, and a DAC 5 that converts the digital signal into an analog signal.

The RF converter 2 is a device that converts the analog signal into an analog RF signal by up-converting a frequency of the analog signal to a radio frequency, and includes a variable attenuator 6 that adjusts an amplitude (power) of the analog RF signal. The RF converter 2 further includes a circuit (not illustrated) having a function of up-converting a frequency. As an example, a frequency of the analog signal in an intermediate frequency bandwidth is 4.5 GHz, and a frequency of the analog RF signal is 24.25 GHz to 29.5 GHZ.

The RF amplifier 3 amplifies the analog RF signal which is output by the RF converter 2 and outputs the amplified analog RF signal from an antenna 13 as a test signal for testing a mobile communication device. The RF amplifier 3 includes a variable attenuator 7 that attenuates the power of the analog RF signal, a divider 8 that branches the analog RF signal having the attenuated power, and a detector 9 that detects the branched analog RF signal and outputs the amplitude (power) of the analog RF signal as a detected voltage. The RF amplifier 3 further includes, in addition to the components, an amplifier (not illustrated) provided at at least one of a front stage or a rear stage of the variable attenuator 7.

Further, the analog RF signal which is output from the RF converter 2 is input to the RF amplifier 3 via an RF cable 12.

Figure 2:
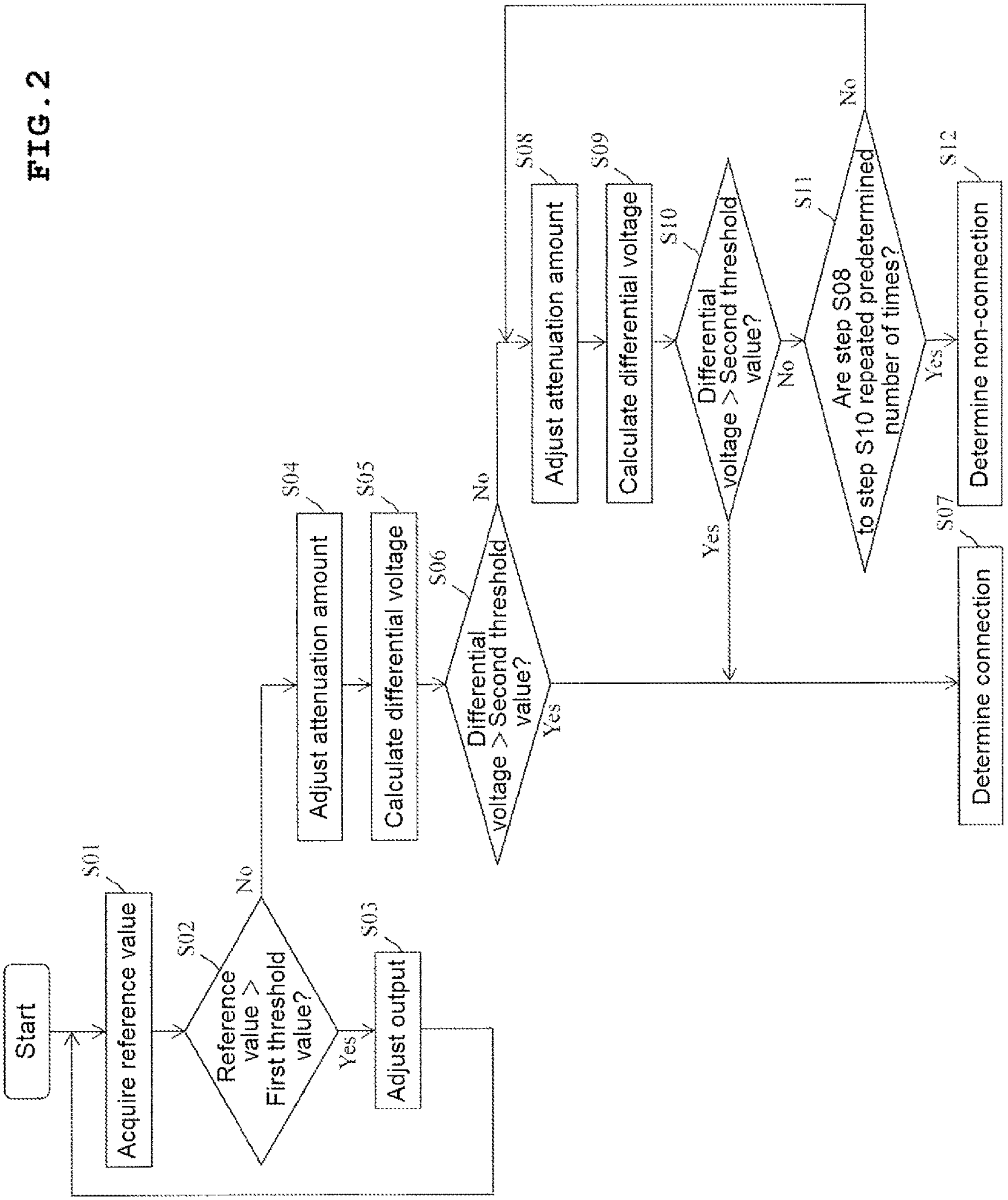
FIG. 2 is a flowchart illustrating a signal generation method according to the present invention.

FIG. 2 is a flowchart illustrating a method by which the control unit 11 controls the RF converter 2 and the RF amplifier 3.

The control unit 11 performs a comparison process (step S01 and step S02) of comparing the detected voltage which is output by the detector 9 when the RF converter 2 outputs the analog RF signal with a first threshold value.

In a case where the detected voltage exceeds the first threshold value ("Yes" in step S02), the control unit 11 causes the RF converter 2 to decrease the power of the analog RF signal by a certain amount and to output the analog RF signal having the decreased power (step S03), and performs the comparison process (step S01 and step S02) again.

In a case where the detected voltage does not exceed the first threshold value ("No" in step S02), the control unit 11 sets the detected voltage as a reference value Vref, and calculates a differential voltage ΔV between the detected voltage which is output by the detector 9 when the attenuation amount of the variable attenuator 7 is decreased (the power of the analog RF signal is increased) and the reference value Vref (step S04 and step S05).

In a case where the differential voltage Vref exceeds a second threshold value ("Yes" in step S06), the control unit 11 determines that the RF converter 2 and the RF amplifier 3 are connected to each other via the RF cable 12 (step S07).

In a case where the differential voltage Vref does not exceed the second threshold value, the control unit 11 further decreases the attenuation amount of the variable attenuator 7 (further increases the power of the analog RF signal), and repeats a rechecking process of comparing the differential voltage Vref with the second threshold value (step S08 to step S11).

In a case where the differential voltage Vref exceeds the second threshold value in the rechecking process ("Yes" in step S10), the control unit 11 determines that the RF converter 2 and the RF amplifier 3 are connected to each other (step S07).

In a case where the differential voltage Vref does not exceed the second threshold value even after the rechecking process is performed a predetermined number of times ("Yes" in step S11), the control unit 11 determines that the RF converter 2 and the RF amplifier 3 are not connected to each other (step S12).

Each step will be explained below, including specific values illustrated in FIG. 3.

The power of the analog RF signal which is output by the RF converter 2 varies depending on temperature and aging. For this reason, first, the power of the analog RF signal which is output from the RF converter 2 is checked. In this process, values in a first column of FIG. 3 are used. The control unit 11 adjusts the attenuation amount of the variable attenuator 7, and sets a signal amplification amount of the RF amplifier 3 to −23 dB.

Step S01:

The analog RF signal which is output from the RF converter 2 and has certain power is attenuated by a predetermined attenuation amount by the variable attenuator 7, and the attenuated analog RF signal is detected by the detector 9. The detector 9 outputs a detected voltage according to the power (amplitude) of the analog RF signal. This detected voltage is set as a reference value.

Step S02:

The amplifier included in the RF amplifier 3 has a rating for the power of the input signal. In a case where the power of the input analog RF signal is too large, the power may exceed the rating of the amplifier. Therefore, it is necessary to check whether or not the power of the analog RF signal which is output from the RF converter 2 is likely to exceed the rating of the amplifier. The control unit 11 compares the reference value with the first threshold value. The first threshold value is set based on the rating of the amplifier of the RF amplifier 3. For example, the first threshold value is 3.2 V.

Step S03:

In a case where the reference value is higher than the first threshold value, the control unit 11 increases the attenuation amount of the variable attenuator 6, and decreases the power of the analog RF signal which is output from the RF converter 2. In addition, step S01 and step S02 are performed again.

In a case where the reference value is lower than or becomes lower than the first threshold value, determination on a connection between the RF converter 2 and the RF amplifier 3 is performed. For example, it is assumed that the reference value is 0.789 V as described in a second column of FIG. 3.

Step S04:

The amplification amount of the RF amplifier 3 is set to −13 dB as described in the second column of FIG. 3. Thus, the control unit 11 adjusts the attenuation amount of the variable attenuator 7 (specifically, decreases the attenuation amount).

Step S05:

The control unit 11 calculates a differential voltage by subtracting the reference value from the detected voltage which is output from the detector 9 at this time. For example, as described in the second column of FIG. 3, in a case where the detected voltage is 0.801 V, the differential voltage is 0.801−0.789=0.012 V.

Step S06:

The control unit 11 compares the differential voltage with the second threshold value. For example, the second threshold value is 0.6V.

In a case where the differential voltage is higher than the second threshold value in step S06, the control unit 11 determines that the RF converter 2 and the RF amplifier 3 are connected to each other via the RF cable 12 (step S07).

Step S08:

On the other hand, in a case where the differential voltage is lower than the second threshold value in step S06 (in a case where the differential voltage is 0.012 V as in the above-described example), the amplification amount of the RF amplifier 3 is set to +12 dB as described in a third column of FIG. 3. Thus, the control unit 11 adjusts the attenuation amount 7 of the variable attenuator (specifically, further decreases the attenuation amount).

Step S09:

The control unit 11 calculates a differential voltage by subtracting the reference value from the detected voltage which is output from the detector 9 at this time. For example, as described in the third column of FIG. 3, in a case where the detected voltage is 2.272 V, the differential voltage is 2.272−0.789=1.483 V.

Step S10:

The control unit 11 compares the differential voltage with the second threshold value again. In a case where the differential voltage is higher than the second threshold value in step S10 (in a case where the differential voltage is 1.483 V as in the above-described example), the control unit 11 determines that the RF converter 2 and the RF amplifier 3 are connected to each other via the RF cable 12 (step S07).

On the other hand, in a case where the differential voltage is lower than the second threshold value in step S10, the control unit 11 determines that the RF converter 2 and the RF amplifier 3 are not connected to each other via the RF cable 12 (step S11). Instead of suddenly performing step S11, step S08 to step S10 may be repeated a predetermined number of times, and in a case where the differential voltage is still lower than the second threshold value, step S11 may be performed.

Finally, the control unit 11 stores results which are obtained in step S07 and step S11 in the storage unit 10 as connection information.

There are predetermined combinations for the number of repetitions of step S08 to step S10, the amount by which the attenuation amount is adjusted in step S08, and the first threshold value and the second threshold value. The control unit 11 selects one from the combinations, and executes the control. This combination has a value according to characteristics of the RF amplifier 3.

Effect

A loss of the RF cable 12 varies depending on a type and a length of the RF cable 12. According to the present invention, even in a case where a path loss due to the RF cable 12 between the RF converter 2 and the RF amplifier 3 is unknown, it is possible to prevent the analog RF signal which is output from the RF converter 2 and has certain power from exceeding the rating of the RF amplifier 3 and to detect connection between the RF converter 2 and the RF amplifier 3.

INDUSTRIAL APPLICABILITY

The present disclosure can be applied to information communication industry.

DESCRIPTION OF REFERENCE NUMERALS AND SIGNS

1: Signal source
2: RF converter
3: RF amplifier
4: Signal generation device
5: DAC
6: Variable attenuator
7: Variable attenuator
8: Divider
9: Detector
10: Storage unit
11: Control unit
12: RF cable

What is claimed is:

1. A signal generation device comprising:

an RF converter that modulates an analog signal for testing and outputs an analog RF signal;

an RF amplifier that includes a variable attenuator which adjusts an amplitude of the analog RF signal by an attenuation amount and a detector which detects the analog RF signal having the adjusted amplitude; and a control unit that controls of the RF converter and the RF amplifier by:

adjusting an output of the RF converter based on a detected voltage which is output by the detector when the RF converter outputs the analog RF signal; and determining whether or not the RF converter and the RF amplifier are connected to each other based on a change in the detected voltage when the attenuation amount of the variable attenuator is changed, wherein the control unit adjusts the output of the RF converter by:

performing a comparison process of comparing the detected voltage which is output by the detector when the RF converter outputs the analog RF signal with a first threshold value; and causing the RF converter to decrease power of the analog RF signal by a certain amount and to output the analog RF signal having the decreased power, and performing the comparison process again in a case where the detected voltage exceeds the first threshold value, and wherein the control unit determines whether or not the RF converter and the RF amplifier are connected to each other by:

setting the detected voltage as a reference value in a case where the detected voltage does not exceed the first threshold value, and calculating a differential voltage between a detected voltage which is output by the detector when the attenuation amount of the variable attenuator is decreased and the reference value;

determining that the RF converter and the RF amplifier are connected to each other in a case where the differential voltage exceeds a second threshold value;

further decreasing the attenuation amount of the variable attenuator, and repeating a rechecking process of comparing the differential voltage with the second threshold value in a case where the differential voltage does not exceed the second threshold value;

determining that the RF converter and the RF amplifier are connected to each other in a case where the differential voltage exceeds the second threshold value in the rechecking process; and determining that the RF converter and the RF amplifier are not connected to each other in a case where the differential voltage does not exceed the second threshold value even after the rechecking process is performed a predetermined number of times.

2. A signal generation method performed by a signal generation device including an RF converter that modulates an analog signal for testing and outputs an analog RF signal, and an RF amplifier that includes a variable attenuator which adjusts an amplitude of the analog RF signal and a detector which detects the analog RF signal having the adjusted amplitude, the method comprising:

performing a comparison process of comparing a detected voltage which is output by the detector when the RF converter outputs the analog RF signal with a first threshold value;

causing the RF converter to decrease power of the analog RF signal by a certain amount and to output the analog RF signal having the decreased power, and performing the comparison process again in a case where the detected voltage exceeds the first threshold value;

setting the detected voltage as a reference value in a case where the detected voltage does not exceed the first threshold value, and calculating a differential voltage between a detected voltage which is output by the detector when the attenuation amount of the variable attenuator is decreased and the reference value;

determining that the RF converter and the RF amplifier are connected to each other in a case where the differential voltage exceeds a second threshold value;

further decreasing the attenuation amount of the variable attenuator, and repeating a rechecking process of comparing the differential voltage with the second threshold value in a case where the differential voltage does not exceed the second threshold value;

determining that the RF converter and the RF amplifier are connected to each other in a case where the differential voltage exceeds the second threshold value in the rechecking process; and determining that the RF converter and the RF amplifier are not connected to each other in a case where the differential voltage does not exceed the second threshold value even after the rechecking process is performed a predetermined number of times.

* * * * *